(12) United States Patent
Niesel et al.

(10) Patent No.: US 9,075,116 B2
(45) Date of Patent: *Jul. 7, 2015

(54) METHOD AND CIRCUIT FOR TESTING A POWER PRODUCER OR A POWER CONSUMER WHICH CAN BE CONNECTED TO A POWER GRID

(75) Inventors: Norbert Niesel, Berlin (DE); Joerg Janning, Berlin (DE)

(73) Assignee: GE Energy Power Conversion Technology Limited, Warwickshire (GB)

( * ) Notice: Subject to any disclaimer, the term of this patent is extended or adjusted under 35 U.S.C. 154(b) by 572 days.

This patent is subject to a terminal disclaimer.

(21) Appl. No.: 13/272,437

(22) Filed: Oct. 13, 2011

(65) Prior Publication Data

US 2012/0092023 A1    Apr. 19, 2012

(30) Foreign Application Priority Data

Oct. 14, 2010    (DE) .......................... 10 2010 048 541

(51) Int. Cl.
*G01R 31/14* (2006.01)
*G01R 31/40* (2014.01)
*G01R 31/34* (2006.01)
*G01R 31/42* (2006.01)

(52) U.S. Cl.
CPC .............. *G01R 31/343* (2013.01); *G01R 31/42* (2013.01)

(58) Field of Classification Search
CPC .............................. G01R 31/343; G01R 31/42
USPC ..................................... 324/511, 764.01, 555
See application file for complete search history.

(56) References Cited

U.S. PATENT DOCUMENTS

| 7,254,045 B2 * | 8/2007 | Imamura ...................... 363/21.1 |
| 8,525,543 B2 * | 9/2013 | Saniter et al. ............. 324/764.01 |
| 2010/0007209 A1 * | 1/2010 | Eppler et al. ..................... 307/36 |
| 2010/0085788 A1 * | 4/2010 | Zacharias et al. ............. 363/123 |
| 2011/0175620 A1 * | 7/2011 | Letas ............................. 324/511 |

FOREIGN PATENT DOCUMENTS

| DE | 102008049629 A1 | 4/2010 |
| EP | 2146264 A1 | 1/2010 |

* cited by examiner

*Primary Examiner* — Jermele M Hollington
*Assistant Examiner* — Farhana Hoque
(74) *Attorney, Agent, or Firm* — Parks Wood LLC

(57) ABSTRACT

Described is a method for testing a power producer or a power consumer that can be connected to a power grid. The power producer or the power consumer is connected to a terminal point. A converter circuit is provided for influencing a voltage that is present at the terminal point. The converter circuit is connected via a transformer to the terminal point. In at least one embodiment, a series connection is configured with a choking coil and a first switch and connected to the terminal point. In a time coordinated manner, the first switch is initially closed and the converter circuit is influenced such that the voltage has the desired value at the terminal point, whereupon the second switch is then opened.

23 Claims, 2 Drawing Sheets

METHOD AND CIRCUIT FOR TESTING A POWER PRODUCER OR A POWER CONSUMER WHICH CAN BE CONNECTED TO A POWER GRID

PRIORITY STATEMENT

The present application hereby claims priority under 35 U.S.C. §119 on German patent application number DE 10 2010 048 541.1 filed Oct. 14, 2010, the entire contents of which are hereby incorporated herein by reference.

FIELD

At least one embodiment of the invention generally relates to a method and/or to a circuit for testing a power producer or a power consumer that can be connected to a power grid. The power producers and the power consumers can be generators, motors, fuel cells, solar-power inverters, so-called power conditioning systems or other electric components which can be connected to a power grid.

At least one embodiment of the invention in particular relates to a method and/or to a circuit for testing a generator used in a wind power plant. It is understood that embodiments of the invention can also be used for a hydroelectric power plant or a gas heating plant or the like.

BACKGROUND

Known are wind power plants provided with a generator which is driven by a wind turbine exposed to the wind for generating power. The generated power is then fed into a power grid.

The operators of power grids have established requirements to be met by a wind power plant before it can be connected to the power grid. A so-called fault-ride-through requirement in that case makes it necessary for the wind power plant to continue to feed power into the power grid, even in the case of an excessive voltage in the power grid.

It is known that the electric components of a wind power plant which function to generate power, meaning in particular the generator and if applicable also the associated converters, are tested separately with the aid of electric simulation circuits. For example, a wind simulation device can simulate with the aid of an electric motor the desired wind which then acts upon the generator. A grid simulation may furthermore be provided which simulates a power grid into which the generator feeds the generated power, wherein this grid simulation is electrically connected to the generator or the associated converters. The grid simulation can be influenced so as to generate a desired voltage course with adjustable frequency for the power grid which can then be specified for the generator.

SUMMARY

The inventors noticed that known methods and circuits can simulate a voltage dip to zero, meaning a short circuit of the power grid; and noticed that they cannot simulate a voltage increase.

At least one embodiment of the present invention is directed to creating a method and a circuit which permits the free adjustment of optional voltage increases with optional frequencies.

According to a first embodiment of the invention, the power producer or the power consumer is connected to a terminal point. A converter circuit is provided which allows influencing the voltage present at the terminal point. The converter circuit is connected via a transformer to the terminal point. Also provided is a series connection configured with a choking coil and a first switch which is connected to the terminal point. Synchronized in time, the first switch is initially closed and the converter circuit influenced such that the voltage at the terminal point reaches the desired value, whereupon the first switch is opened.

The excessive voltage of the simulated power grid is generated through the interaction of several measures. By closing the first switch, the voltage at the terminal point dips. This voltage dip is counteracted by correspondingly influencing the converter circuit. The subsequent opening of the first switch then leads to an increase in the voltage at the terminal point. These actions have the advantage that an excessive voltage can be simulated easily and without considerable additional expenditure. As such, the testing of the power producer or the power consumer can thus be simplified and improved considerably.

According to a second embodiment of the invention, the power producer or the power consumer is connected to a terminal point where a voltage is present. A series connection is provided which is configured with a choking coil and a first switch and which is connected to the terminal point. Also provided is a parallel connection which is configured with a choking coil and a second switch and is also connected to the terminal point. The series connection can be admitted with a voltage that is higher than the voltage at the terminal point. Synchronized in time, the first switch is on the one hand closed so that the voltage at the terminal point increases while, on the other hand, the second switch is opened.

The excessive voltage for the simulated consumer is obtained by closing the first switch and opening the second switch. By closing the first switch, the voltage used to admit the series connection reaches the terminal point where it causes a voltage increase. By opening the second switch, an increased voltage can develop at the terminal point.

These steps have the advantage that a simulated, excessive voltage can be achieved with little expenditure. A further advantage of an embodiment of the invention is that a converter circuit is not absolutely required in this case. The testing of the power producer or the power consumer can thus be simplified and improved considerably.

A different embodiment of the invention is provided with a converter circuit which is connected to the parallel circuit and can be used to influence the voltage present at the terminal point. Synchronized in time, the first switch is closed on the one hand and, on the other hand, the converter circuit is influenced in such a way that the voltage at the terminal point transitions to an increased value. The manner in which the voltage transitions at the terminal point to the increased voltage can be influenced with the aid of the converter circuit.

According to a different embodiment of the invention, the switch or switches is/are embodied as electronic semiconductor component or components, for example as a thyristor with or without the associated quenching circuit or as a GTO thyristor (GTO=gate turn-off) or as an IGBT (IGBT=insulated gate bipolar transistor) that can be switched off. The resulting advantage is that the moment at which the switch or switches is/are activated can be controlled easily and precisely. The use of thyristors without a quenching circuit can be particularly advantageous since these thyristors relatively realistically simulate the behavior of a medium voltage switch.

According to another modification of an embodiment of the invention, the inductance or inductances of the choking coil or coils is/are adjustable. The same type of voltage dips can thus be achieved for different frequencies of the simulated power grid.

BRIEF DESCRIPTION OF THE DRAWINGS

Additional features, options for use and advantages of the invention follow from the description below of example embodiments of the invention which are illustrated in the Figures of the drawing. All features described or shown herein, either by themselves or in any optional combination, represent the subject matter of the invention, regardless of how they are combined in the patent claims and their references back, as well as independent of their formulation and/or representation in the specification or in the drawing.

DETAILED DESCRIPTION OF THE EXAMPLE EMBODIMENTS

Figure 1:
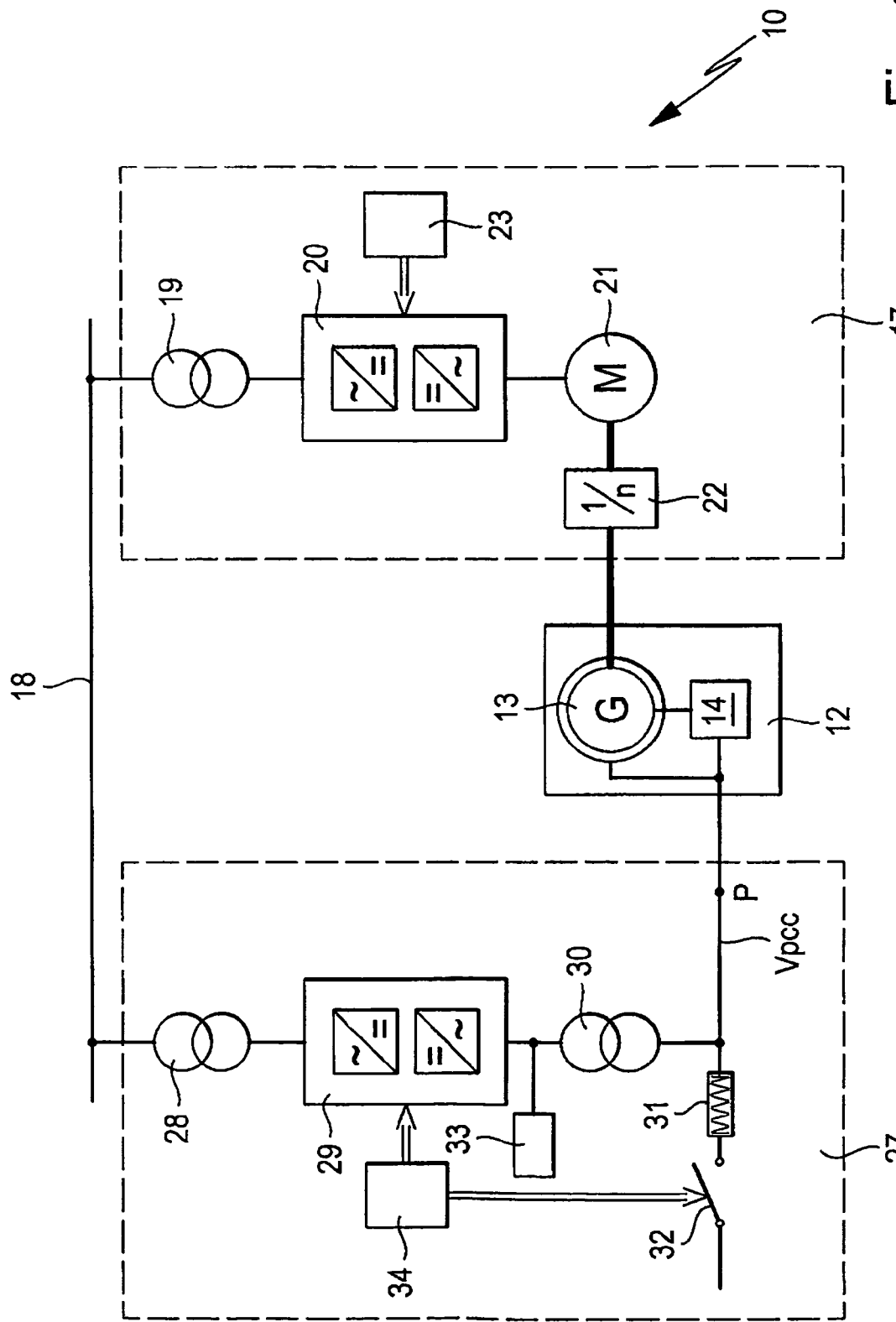
FIG. 1 shows a schematic block diagram of a first example of a circuit according to an embodiment of the invention for testing a generator that is used, in particular, for a wind power plant.

Various example embodiments will now be described more fully with reference to the accompanying drawings in which only some example embodiments are shown. Specific structural and functional details disclosed herein are merely representative for purposes of describing example embodiments. The present invention, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the present invention to the particular forms disclosed. On the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or," includes any and all combinations of one or more of the associated listed items.

It will be understood that when an element is referred to as being "connected," or "coupled," to another element, it can be directly connected or coupled to the other element or intervening elements may be present. In contrast, when an element is referred to as being "directly connected," or "directly coupled," to another element, there are no intervening elements present. Other words used to describe the relationship between elements should be interpreted in a like fashion (e.g., "between," versus "directly between," "adjacent," versus "directly adjacent," etc.).

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, term such as "below" can encompass both an orientation of above and below. The device may be otherwise oriented (rotated 90 degrees or at other orientations) and the spatially relative descriptors used herein are interpreted accordingly.

Although the terms first, second, etc. may be used herein to describe various elements, components, regions, layers and/or sections, it should be understood that these elements, components, regions, layers and/or sections should not be limited by these terms. These terms are used only to distinguish one element, component, region, layer, or section from another region, layer, or section. Thus, a first element, component, region, layer, or section discussed below could be termed a second element, component, region, layer, or section without departing from the teachings of the present invention.

The circuit 10 shown for the present example embodiment in FIG. 1 is used in a wind power plant. It is understood that the circuit 10 can also be used in connection with a hydroelectric power plant or a gas power plant or the like. The circuit 10 according to the present example is furthermore provided for testing a generator. It is understood that other power producers or power consumers can also be tested with the circuit 10, for example an electric motor or a fuel cell or a solar-power inverter or a so-called power conditioning system or the like.

For the sake of simplification, the circuit 10 in FIG. 1 is shown only as single-phase circuit. It is understood that the circuit 10 can also have a two-phase or a multiphase layout.

The circuit 10 is provided with a generator circuit 12 which is to be tested. The generator circuit 12 relates to those components of the wind power plant which are used to generate power. For the present example embodiment, the generator circuit 12 is configured, for example, with a doubly-fed asynchronous generator 13 with associated converters 14. The rotor of the asynchronous generator 13 is connected via the converters to a terminal point on the generator circuit 12 while the stator of the asynchronous generator 13 is connected directly to this terminal point. It is understood that other types of generators can also be used, for example synchronous generators and/or that the converters can be omitted completely.

The circuit 10 comprises a wind simulation 17 which, for the present example embodiment, is intended to simulate the wind that drives the asynchronous generator 13. The wind simulation 17 is configured with a transformer 19 which is connected to a power grid 18, a converter circuit 20 and an electric motor 21. The drive shaft of the electric motor 21 is connected so as to rotate along with the drive shaft of the generator 13, if applicable via a gear 22 that is connected in-between.

With the aid of a control and/or regulating unit 23, the converter circuit 20 can be influenced over time in such a way that the resulting speed course for the electric motor 21 corresponds to the desired wind power for operating the asynchronous generator 13.

The electric circuit 10 need not be set up directly at the location of the wind power plant, but can be installed independent of the wind power plant, for example in a testing facility. It is understood, however, that the circuit 10 can also be installed directly adjacent to the wind power plant. In that case, the generator circuit 12 is installed in the wind power plant. Thus, the asynchronous generator 13 in particular is fixedly connected to rotate along with the wind turbine of the wind power plant and the wind simulation 17 can be omitted.

The circuit 10 comprises a grid simulation 27 which is intended to simulate the voltage course over time of a simulated power grid. The generator circuit 12 feeds power into this simulated power grid. The grid simulation 27 consists of a transformer 28 that is connected to the power grid 18, a converter circuit 29 and an additional transformer 30. The converter circuit 29 is connected via the additional transformer 30 to the generator circuit 12 and in the present example embodiment to the aforementioned terminal point of the generator circuit 12. Starting with this terminal point of the generator circuit 12, a further terminal point P on which a voltage Vpcc is present (pcc=point of common coupling) is provided on the connection to the transformer 30.

The additional transformer 30 can alternatively also be replaced by a choking coil, in particular with a suitable layout of the converter circuit 29. This is a particularly cost-effective solution if the transmission ratio of the transformer 30 is not required.

As an alternative, it is furthermore possible to provide a joint direct voltage rail between the two converter circuits 20, 29 of the wind simulation 17 and the grid simulation 27. In that case only a single grid-side converter and only a single transformer are required in the direction toward the power grid 18.

A series connection that is configured with a choking coil 31 and a first switch 32 is connected to the terminal point P. The sequence within the series connection is unimportant in this case, so that the switch 32 can also be connected to the terminal point P. The series connection can be connected to a neutral point for several phases. The series connection can furthermore form a component of a delta connection for several phases. If applicable, the series connection can also be connected to ground.

A filter circuit 33 is furthermore also connected between the converter circuit 29 and the transformer 30.

The inductance of the choking coil 31 can be changed, for example by manually adjusting the number of windings for the choking coil 31 with the aid of mechanical devices. With corresponding adjustments of the choking coil 31, the same type of processes can essentially be generated for the power grid, independent of the frequency of the simulated power grid.

The first switch 32 is embodied as electronic semiconductor component. The switch 32 can be a thyristor with or without the associated quenching circuit, for example, or a GTO thyristor (GTO=gate turnoff), or an IGBT (IGBT=insulated gate bipolar transistor) that can be turned off or the like, wherein these components are preferably configured as modules and thus can already comprise free-wheeling diodes and the like.

The filter circuit 33 can be a known circuit which can be used to smooth the voltage Vpcc.

With the aid of a control and/or regulating unit 34, the converter circuit 29 can be influenced over time in such a way that the resulting time-dependent course of the voltage Vpcc corresponds to a desired, specified voltage course for a power grid. The specified voltage courses in that case can be adjusted symmetrical or asymmetrical. Different frequencies of the simulated power grid can furthermore be adjusted freely with the aid of the converter circuit 29, especially 50 Hz and 60 Hz.

The control and/or regulating unit 34 is furthermore provided for switching the switch 32 from a closed to an opened state and vice versa. In the following, we proceed on the assumption that the switch 32 is in the opened state and that the choking coil 31 is thus not activated.

On the whole, a generator circuit 12 to be tested can be subjected with the aid of the wind simulation 17 to a desired wind force and with the aid of the grid simulation 27 to a specified voltage course for the supplied power grid. The circuit 10 is thus among other things suitable for testing the behavior of the generator circuit 12 during a single-phase or the multiphase voltage overload at a specified overvoltage in the supplied power grid.

If the switch 32 is opened, the voltage Vpcc is adjusted with the aid of the converter circuit 29 to a desired value for the voltage of the supplied power grid.

To simulate a voltage overload in the supplied power grid, two measures are realized synchronized in time by the grid simulation 27. The first switch 32 is initially switched to the closed state so that the voltage Vpcc is present via the choking coil 31. This results per se in a voltage dip of the voltage Vpcc which, however, is compensated again by the converter circuit 29, such that the voltage Vpcc continues to be controlled or regulated to the desired voltage for the supplied power grid. Following this, the switch 32 is switched to the opened state, thereby resulting in an increase of the voltage Vpcc. The overvoltage which can thus be reached depends among other things on the voltage present at the transformer 30. The course and the scope of the voltage overload can additionally be influenced or supported by the converter circuit 29.

The aforementioned measures are not realized simultaneously but for the most part run down during a coinciding time range. The coordination in time of the two measures, relative to each other, is critical so that the transition to the desired voltage overload of the simulated power grid, which is fed by the generator circuit 12, follows the desired course.

An increase to an overvoltage in the power grid which is fed by the generator circuit 12 can be simulated by taking the aforementioned measures—as explained—thereby making it possible to test how the generator circuit 12 will behave in such a case. In particular, it is possible to test whether the generator circuit 12 meets the so-called fault-ride-through conditions.

To stop the simulated overload in the voltage for the power grid, the two previously explained measures are reversed again by the grid simulation 27. Whether these measures are taken simultaneously or the sequence in which these measures are taken does not matter in this case, only that these measures are coordinated in time. For example, the converter circuit 29 can be influenced in such a way that the voltage Vpcc again reverts to the desired voltage value for the supplied power grid. This transition can be aided by temporarily closing the first switch 32.

Figure 2:
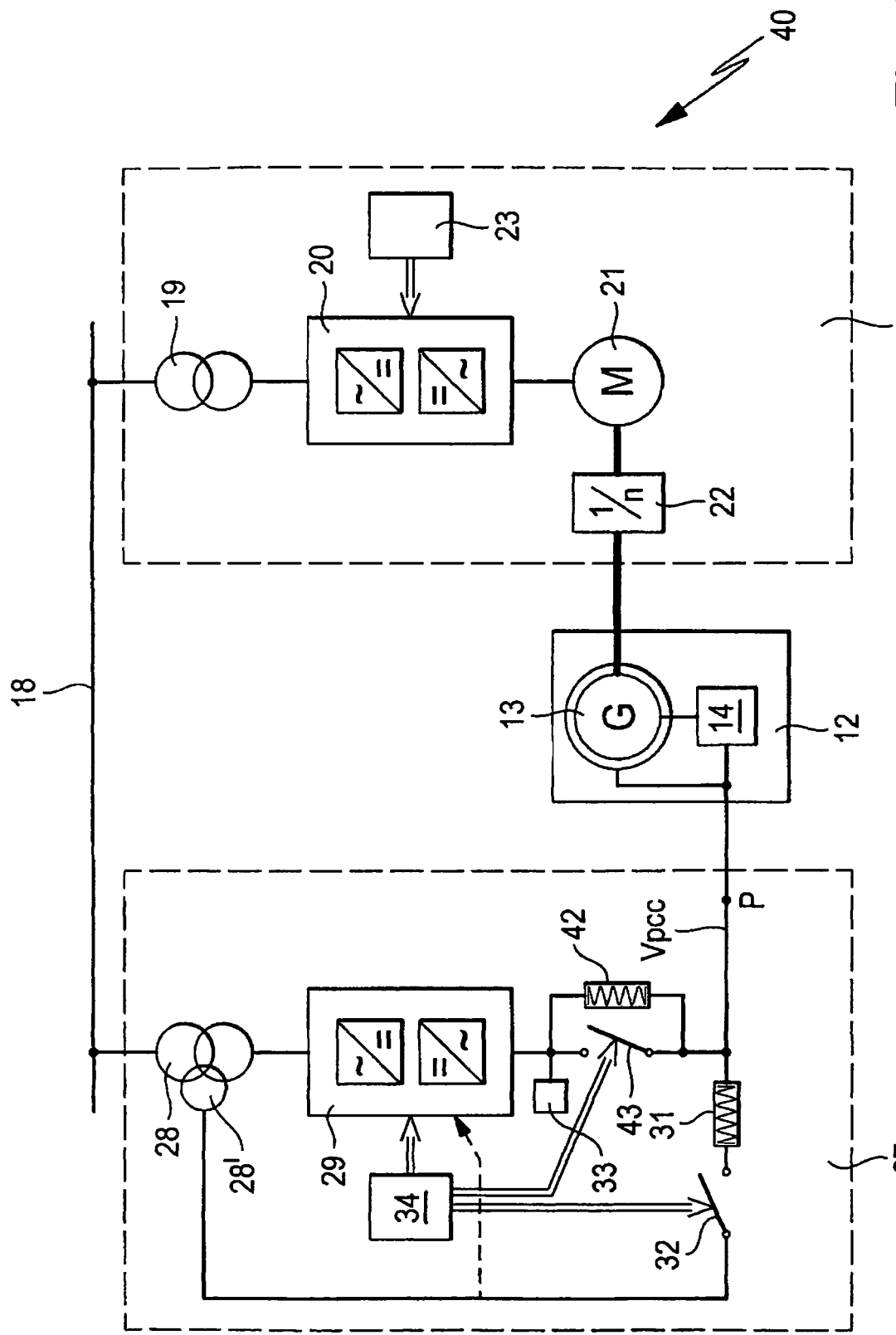
FIG. 2 shows a schematic block diagram of a second example embodiment of a corresponding circuit.

A circuit 40 is shown in FIG. 2 which is based on the circuit 10 shown in FIG. 1. No further explanations will be provided for the components of the circuit 40 which coincide with the components of the circuit 10 shown in FIG. 1. In the following, only components and functions of the circuit 40 in FIG. 2, which differ from those of the circuit 10 in FIG. 1, will be explained further.

To complement the circuit 10 in FIG. 1, the circuit 40 in FIG. 2 comprises a parallel circuit consisting of a choking coil 42 and a second switch 43. The transformer 28 furthermore comprises an additional winding 28' which is connected to the switch 32. The step up ratio of the additional winding 28' to the primary winding of the transformer 28 in this case is selected such that the voltage at this winding 28' is higher than the desired voltage value, which is provided per se as the Vpcc voltage for the simulated power grid.

In contrast to the circuit 10 shown in FIG. 1, the circuit 40 in FIG. 2 does not comprise an additional transformer 30. We want to point out, however, that the additional transformer 30 from FIG. 1 as such can also be provided for the circuit 40 in FIG. 2.

The aforementioned parallel circuit for the choking coil 42 and the second switch 43 is connected between the converter circuit 29 and the terminal point P. Insofar as an additional transformer 30 is provided, the parallel circuit is connected in-between the additional transformer 30 and the terminal point P. However, the additional transformer P can also be connected between the terminal point P and the aforementioned parallel connection.

The inductance of the choking coil 42 can be changed, for example through a manual adjustment of the number of windings on the choking coil 42 with the aid of mechanical devices.

The second switch 43 is embodied as electronic semiconductor component. For example, the switch 43 can be a thyristor with an associated quenching circuit or a GTO-thyristor [GTO=gate turnoff] or an IGBT [IGBT=insulated gate bipolar transistor] that can be switched off or the like, wherein these components are preferably configured as modules and thus can already contain, for example, free-wheeling diodes and the like.

The control and/or regulating unit 34 is furthermore provided for switching the second switch 43 from a closed to an opened state and vice versa. In the following, we proceed on the assumption that the switch 32 is in an opened state and the switch 43 is in the closed state. Both choking coils 32, 42 are consequently not activated.

In order to simulate a voltage overload for the supplied power grid, the grid simulation 27 realizes three measures in a time-coordinated manner. On the one hand, the second switch 43 is opened while, on the other hand, the converter circuit 29 is influenced such that the voltage Vpcc transitions with a desired transition behavior to the desired, specified overvoltage. The first switch 32 is furthermore switched to its closed state, so that the voltage of the coil 28' for the transformer 28 flows via the choking coil 31 to the terminal point P. The desired overvoltage therefore depends, among other things, on the voltage present at the winding 28' of the transformer 28. The three measures need not be realized simultaneously, but are realized during a mostly coinciding time range. The sequence of the aforementioned measures is thus not in the foreground. Essential is that the three measures are coordinated in time, so that the transition to the desired voltage overload for the simulated power grid which is fed by the generator circuit 12 follows the desired course.

The three measures are synchronized, for example, in such a way that the second switch 43 is opened first and the switch 32 is then closed. The voltage Vpcc is subsequently influenced with the aid of the converter circuit 29 in such a way that it transitions to the specified overvoltage. At least these three measures are coordinated in time, such that the opening of the switch 43 occurs during a time interval prior to when the voltage overload of the voltage Vpcc is simulated.

In addition, we want to point out that the converter circuit 29 can be influenced with the above-explained measures in such a way that the voltage is phase-synchronized as closely as possible with the voltage present at the winding 28' of the transformer 28, as indicated in FIG. 2 with a dashed arrow.

It is furthermore possible to omit the converter circuit 29 for simulating the voltage overload in the supplied power grid if a precise adjustment of the voltage course can be omitted or is not desired. The transformer 28 in that case is directly connected to the aforementioned parallel connection. For example, the second switch 43 can then be opened first and the switch 32 can be closed. The increased voltage at the winding 28' of the transformer then flows via the choking coil 31 to the terminal point P.

As previously explained, these measures can be used to simulate an overload of the voltage in the power grid which is fed by the generator circuit 12, thereby making it possible to test how the generator circuit 12 behaves in those cases. In particular, it can be tested whether the generator circuit 12 meets the previously mentioned fault-ride-through conditions.

To stop the simulated voltage overload in the power grid, the three measures explained in the above are reversed by the grid simulation 27. Again, it is not important whether this occurs simultaneously or in what sequence the measures are realized, but only that these measure are coordinated in time. For example, the first switch 32 is opened first and then the second switch 43 is then switched to the closed state, so as to influence the converter circuit 29 in such a way that the voltage Vpcc again drops to a desired value.

The patent claims filed with the application are formulation proposals without prejudice for obtaining more extensive patent protection. The applicant reserves the right to claim even further combinations of features previously disclosed only in the description and/or drawings.

The example embodiment or each example embodiment should not be understood as a restriction of the invention. Rather, numerous variations and modifications are possible in the context of the present disclosure, in particular those variants and combinations which can be inferred by the person skilled in the art with regard to achieving the object for example by combination or modification of individual features or elements or method steps that are described in connection with the general or specific part of the description and are contained in the claims and/or drawings, and, by way of combinable features, lead to a new subject matter or to new method steps or sequences of method steps, including insofar as they concern production, testing and operating methods.

References back that are used in dependent claims indicate the further embodiment of the subject matter of the main claim by way of the features of the respective dependent claim; they should not be understood as dispensing with obtaining independent protection of the subject matter for the combinations of features in the referred-back dependent claims. Furthermore, with regard to interpreting the claims, where a feature is concretized in more specific detail in a subordinate claim, it should be assumed that such a restriction is not present in the respective preceding claims.

Since the subject matter of the dependent claims in relation to the prior art on the priority date may form separate and independent inventions, the applicant reserves the right to make them the subject matter of independent claims or divisional declarations. They may furthermore also contain independent inventions which have a configuration that is independent of the subject matters of the preceding dependent claims.

Further, elements and/or features of different example embodiments may be combined with each other and/or substituted for each other within the scope of this disclosure and appended claims.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for a power producer or a power consumer which is connectable to a power grid, the method comprising:
   connecting the power producer or the power consumer with a converter circuit via a transformer at a terminal point;
   connecting a first switch and a choking coil in a series connection with the terminal point;
   in a time-coordinated manner, closing the first switch and influencing the converter circuit to adjust voltage at the terminal point to a desired value; and
   subsequently opening the first switch for simulation of a voltage overload on the power grid.

2. The method according to claim 1, wherein the closing of the first switch leads to a dip in the voltage at the terminal point and wherein influencing of the converter circuit counteracts the dip.

3. The method according to claim 1, wherein the subsequent opening of the first switch results in an increase in the voltage at the terminal point.

4. The method according to claim 1, wherein the converter circuit is influenced in such a way that the voltage at the terminal point drops from an increased value to the desired value.

5. The method according to claim 4, wherein the first switch is temporarily closed in a time-coordinated manner.

6. A circuit connectable to a power grid, the circuit comprising:
   a power producer or consumer being connected with a terminal point and configured to generate power;
   a grid simulation circuit connected with the power producer or consumer and configured to simulate a desired voltage of the power grid, and comprising:
      a converter circuit, provided to influence a voltage present at the terminal point, connected via a transformer or a choking coil to the terminal point;
      a series connection, configured with a choking coil and a first switch, and the series connection being connected to the terminal point; and
   a control and/or regulating unit configured to, in a time-coordinated manner, initially close the first switch and then influence the converter circuit to adjust the voltage at the terminal point to a desired value, and then to open the first switch for simulation of a voltage overload on the power grid.

7. The circuit according to claim 6, wherein the control and/or regulating unit is provided to influence the converter circuit in such a way that the voltage at the terminal point drops from an overvalue to the desired value.

8. A method for a power producer or a power consumer connectable to a power grid, the power producer or the power consumer being connected to a terminal point and a voltage being present at the terminal point, a series connection, configured with a choking coil and a first switch, the series connection being connected to the terminal point by the choking coil and a parallel connection, configured with a second choking coil and a second switch, being connected to the terminal point, the method comprising:
   supplying the series connection with a voltage which is relatively higher than the voltage at the terminal point;
   closing the first switch so that a voltage increases at the connecting point; and subsequently opening the second switch.

9. The method according to claim 8, wherein a converter circuit is provided which is connected to the parallel connection and which is usable to influence the voltage present at the terminal point, and wherein the first switch is closed in a time-coordinated manner and the converter circuit is influenced in such a way that the voltage at the terminal point transitions to an increased value.

10. The method according to claim 9, wherein initially the second switch is opened and then the first switch is closed and following that, the converter circuit is influenced in such a way that the voltage transitions to the increased value.

11. The method according to claim 8, wherein the first switch is opened so that the voltage drops at the terminal point and wherein the second switch is closed in a time-coordinated manner with the opening of the first switch.

12. A circuit for a power producer or a power consumer connectable to a power grid, wherein the power producer or the power consumer is connected to a terminal point, and wherein a voltage is present at the terminal point, that the circuit comprising:
   a series connection, configured with a choking coil and a first switch, the series connection being connected to the terminal point by the choking coil;
   a parallel connection, configured with a choking coil and a second switch and connected to the terminal point, the series connection to be supplied with a voltage that is relatively higher than the voltage at the terminal point; and
   a control and/or regulating unit, to close, in a time-coordinated manner, the first switch so that the voltage rises at the terminal point and to open the second switch.

13. The circuit according to claim 12, further comprising:
   a converter circuit, connected to the parallel connection, to influence the voltage at the terminal point, wherein the control and/or regulation unit is provided to close in a time coordinated manner on the one hand the first switch and, on the other hand, the converter circuit in such a way that the voltage increases at the terminal point.

14. The circuit according to claim 13, wherein the control and/or regulating unit is provided to open the first switch so that the voltage drops at the terminal point and to close the second switch in a time-coordinated manner with the opening of the first switch.

15. The circuit according to claim 14, wherein a transformer is provided to tap the voltage which is used for admitting the series connection.

16. The circuit according to claim 12, wherein the control and/or regulating unit is provided to open the first switch so that the voltage drops at the terminal point and to close the second switch in a time-coordinated manner with the opening of the first switch.

17. The method according to claim 16, wherein the subsequent opening of the first switch results in an increase in the voltage at the terminal point.

18. The method according to claim 17, wherein the converter circuit is influenced in such a way that the voltage at the terminal point drops from an increased value to the desired value.

19. The circuit according to claim 12, wherein a transformer is provided to tap the voltage which is used for admitting the series connection.

20. A method for a power producer or a power consumer which is connectable to a power grid, the method comprising:
    connecting the power producer or power consumer with a converter circuit via a transformer at a terminal point
    influencing a voltage present at the terminal point, via the transformer or a choking coil to the terminal point;
    configuring a series connection with the choking coil and a first switch; connecting the series connection to the terminal point;
    in a time coordinated manner, closing the first switch and influencing the converter circuit to adjust the voltage at the terminal point to a desired value; and
    subsequently opening the first switch for simulation of a voltage overload on the power grid.

21. The method according to claim 20, wherein the closing of the first switch leads to a dip in the voltage at the terminal point and wherein the converter circuit counteracts the dip.

22. A method for a power producer or a power consumer connectable to a power grid, the power producer or the power consumer being connected to a terminal point and a voltage being present at the terminal point, the method comprising:
    connecting a series connection, configured with a choking coil and a first switch, to the terminal point by the choking coil;
    connecting a parallel connection, configured with a second choking coil and a second switch, to the terminal point;
    supplying the series connection with a voltage which is relatively higher than the voltage at the terminal point;
    closing the first switch so that a voltage increases at the connecting point; and
    subsequently opening the second switch.

23. The method according to claim 22, wherein a converter circuit is provided which is connected to the parallel connection and which is usable to influence the voltage present at the terminal point, and wherein the first switch is closed in a time-coordinated manner and the converter circuit is influenced in such a way that the voltage at the terminal point transitions to an increased value.

* * * * *